United States Patent

Itano

[11] Patent Number: 6,008,544
[45] Date of Patent: Dec. 28, 1999

[54] SEMICONDUCTOR DEVICE AND MANUFACTURING METHOD OF THE SEMICONDUCTOR DEVICE

[75] Inventor: Kiyoshi Itano, Kawasaki, Japan

[73] Assignee: Fujitsu Limited, Kawasaki, Japan

[21] Appl. No.: 08/758,852

[22] Filed: Dec. 2, 1996

Related U.S. Application Data

[63] Continuation of application No. 08/524,149, Aug. 17, 1995, abandoned, which is a continuation of application No. 08/162,259, Dec. 7, 1993, abandoned.

[30] Foreign Application Priority Data

Dec. 8, 1992 [JP] Japan .................................. 4-328197

[51] Int. Cl.[6] .................................. H01L 27/088
[52] U.S. Cl. .................................. 257/900; 257/316
[58] Field of Search .................................. 257/900, 315, 257/316, 412, 768, 773

[56] References Cited

U.S. PATENT DOCUMENTS

| | | | |
|---|---|---|---|
| 5,132,758 | 7/1992 | Minami et al. | 257/900 |
| 5,146,291 | 9/1992 | Watabe et al. | 257/900 |
| 5,194,929 | 3/1993 | Ohshima et al. | 257/326 |

FOREIGN PATENT DOCUMENTS

| | | | |
|---|---|---|---|
| 61-53775 | 3/1986 | Japan | 257/900 |

*Primary Examiner*—Mark V. Prenty
*Attorney, Agent, or Firm*—Armstrong, Westerman, Hattori, McLeland & Naughton

[57] ABSTRACT

The present invention relates to a semiconductor device including an insulated-gate field effect transistor having a contact hole formed in an inter-layer insulating film on an S/D region adjacent to a gate electrode and has an object to provide a semiconductor device capable of securing the uniformity of the thickness of an insulating film between a gate electrode and an S/D electrode or interconnection layer while integrating elements at a high density. The semiconductor device comprises an S/D region formed in a semiconductor layer at the both sides of the gate electrode, an insulating side wall formed on side surface of the gate electrode, a conducting side wall covering side surface of the insulating side wall and contacting the S/D region, a covering insulating film for covering the gate electrode, S/D region, insulating side wall, and conducting side wall, and a contact hole formed in the covering insulating film on the S/D region of at least one side.

3 Claims, 11 Drawing Sheets

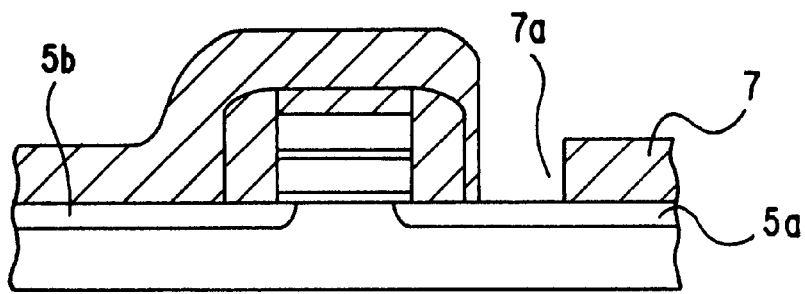
FIG.IE
PRIOR ART
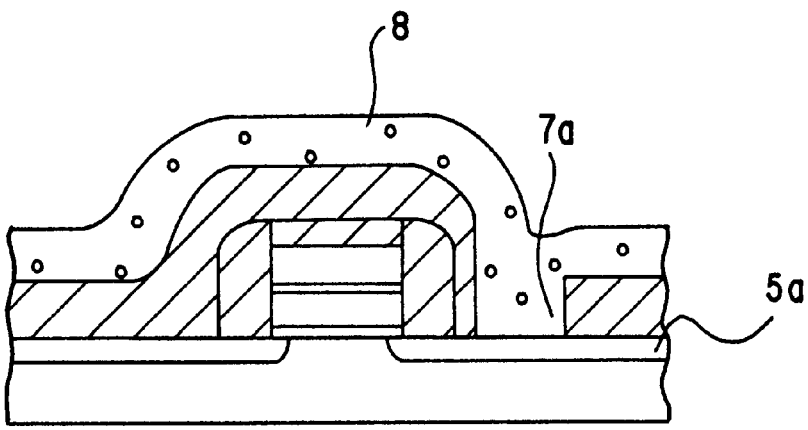
FIG.IF
PRIOR ART

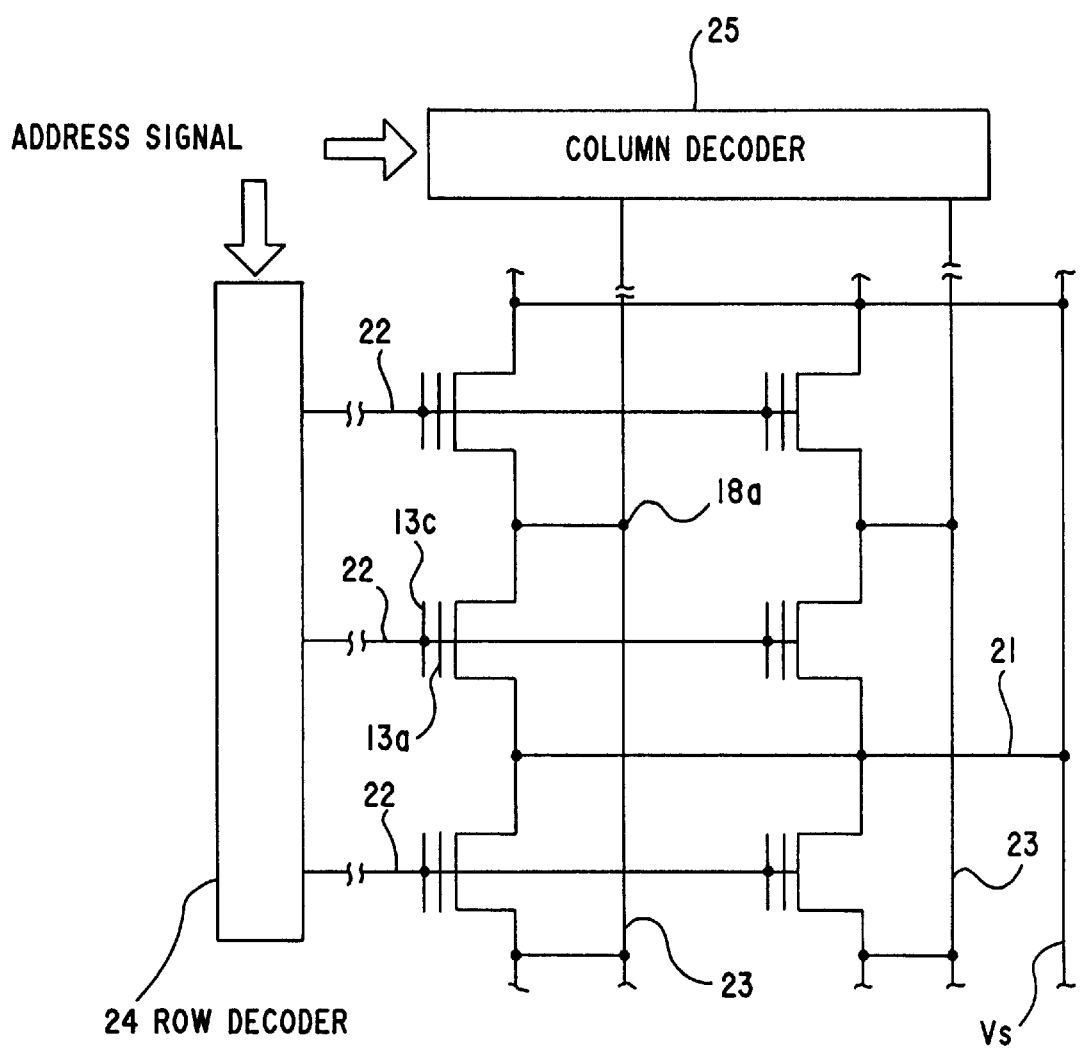

SEMICONDUCTOR DEVICE AND MANUFACTURING METHOD OF THE SEMICONDUCTOR DEVICE

This application is a continuation of application Ser. No. 08/524,149 filed Aug. 17, 1995, now abandoned, which is a continuation of application Ser. No. 08/162,259 filed Dec. 7, 1993, now abandoned.

BACKGROUND OF THE INVENTION

1. Field of the Invention

The present invention relates to a semiconductor device and its manufacturing method, particularly to a semiconductor device comprising an insulated-gate field effect transistor having a contact hole formed in an inter-layer insulating film on a source/drain region (hereinafter referred to as S/D region) adjacent to a gate electrode.

2. Description of the Prior Art

A higher integration level has been requested for a semiconductor memory in recent years, therefore, it is necessary to further fine a pattern. As one of the means for realizing a higher integration level, insulated-gate field effect transistor is further fined which serves as a component of the semiconductor memory.

FIG. 1A to FIG. 1F are sectional views for explaining a method for manufacturing an insulated-gate field effect transistor having a contact hole formed in an inter-layer insulating film on an S/D region of both sides of a gate electrode. The insulated-gate field effect transistor uses an insulated-gate field effect transistor having a floating gate in an EPROM cell.

FIG. 1A shows a state after a floating gate and a control gate are formed and moreover a S/D region is formed in a surface layer of a semiconductor substrate of both sides of the control gate.

In FIG. 1A, symbol 1 is a semiconductor substrate, 2 is a gate insulating film on the semiconductor substrate 1, 3a is a floating gate on the gate insulating film 2, 3c is a control gate formed above the floating gate 3a through an insulating film 3b, 4 is an insulating film on the control gate 3c, and 5a and 5b are S/D regions formed in the surface layer of the semiconductor substrate 1 of both sides of the control gate 3c.

Under the above state, as shown in FIG. 1B, an insulating film 6 is formed by covering the gate insulating film 2, floating gate 3a, insulating film 3b, and control gate 3c in order to form a side wall.

Then, as shown in FIG. 1C, an insulating side wall 6a is formed on the side surface of the gate electrode 3 by anisotropically etching the insulating film 6.

Then, as shown in FIG. 1D, an inter-layer insulating film 7 is formed on the entire surface.

Then, as shown in FIG. 1E, the inter-layer insulating film 7 on the S/D region 5a is selectively etched and removed to form a contact hole 7a in the inter-layer insulating film 7 on the S/D region 5a.

Then, as shown in FIG. 1F, a conducting film is formed and thereafter patterned to form a source/drain electrode (hereinafter referred to as S/D electrode) or interconnection layer 8 which connects with the S/D region 5a through the contact hole 7a.

For the above existing method for fabricating a semiconductor device, however, it is necessary to decrease the size of the S/D regions 5a and 5b and bring the contact hole 7a as closely to the gate electrode 3 as possible in order to integrate elements at a high density. For this reason, in the case that a deviation of an alignment occurs when patterning a contact hole, the contact hole 7a may be formed by etching the side wall 6a as shown in FIG. 2.

Therefore, when an S/D electrode or interconnection layer is formed in the contact hole 7a, the thickness of an insulating film between the gate electrode 3 and the S/D electrode or interconnection layer fluctuates. For this reason, a problem occurs that parasitic capacitance fluctuates or accumulated electric charges fluctuate due to leakage of them.

Besides, an existing example is shown in a patent document of the Japanese unexamined publication (KOKAI) 3-96271. In this case, the same problem as described above might occur, too.

SUMMARY OF THE INVENTION

It is an object of the present invention to provide an insulated-gate field effect transistor for securing the uniformity of the thickness of an insulating film put between the side surface of a gate electrode and an S/D electrode or interconnection layer while integrating elements at a high density and its manufacturing method.

The insulated-gate field effect transistor according to the present invention has a conducting side wall covering an insulating side wall of a gate electrode of the side where a contact hole is formed and contacting an S/D region.

Therefore, even if a deviation of an alignment occurs and the contact hole to the S/D region approaches the gate electrode, it is brought onto the conducting side wall. Thus, when an S/D electrode is formed in the contact hole, only the insulating side wall remains as an insulating film actually put between the S/D electrode and gate electrode because the S/D electrode contacts the conducting side wall. Therefore, its thickness becomes constant independently of the position of the contact hole.

Moreover, in case that the contact hole goes away from the gate electrode, the conducting side wall is covered with a covering insulating film and the S/D electrode formed in the contact hole does not contact the conducting side wall. Even in this case, as both the conducting side wall and S/D electrode contact the S/D region, the conducting side wall and the S/D electrode have the same potential, so that only the insulating side wall remains as an insulating film actually present between the S/D electrode and gate electrode. Thereby, its thickness becomes constant independently of the position of the contact hole.

Furthermore, when forming by introducing impurities a bulk interconnection layer in the semiconductor layer of a side where no contact hole is formed, the second conducting side wall is left at the side where no contact hole is formed and serves as a mask for etching a natural oxide film and introducing impurities while the semiconductor layer is masked at the side where a contact hole is formed.

Thus, the allowance for mask alignment increases and the mask is easily formed. Moreover, a sufficient distance between a channel region under the gate electrode and a bulk interconnection layer is secured so that preventing a channel length from becoming short and a gate control voltage from fluctuating.

BRIEF DESCRIPTION OF THE DRAWING

FIG. 1A to FIG. 1F are sectional views for explaining a method for manufacturing a semiconductor device according to the prior art;

FIG. 5 is a circuit block diagram including the insulated-gate field effect transistor of the embodiment of the present invention shown in FIG. 3H.

DESCRIPTION OF THE PREFERRED EMBODIMENT

The insulated-gate field effect transistor of the embodiment of the present invention having a contact hole formed in an inter-layer insulating film on an S/D region adjacent to a gate electrode is described below by referring to FIG. 3A to FIG. 3H, FIG. 4A to FIG. 4E, FIG. 5 and FIG. 6. The insulated-gate field effect transistor uses an insulated-gate field effect transistor having a floating gate in an EPROM cell.

Figure 1A:
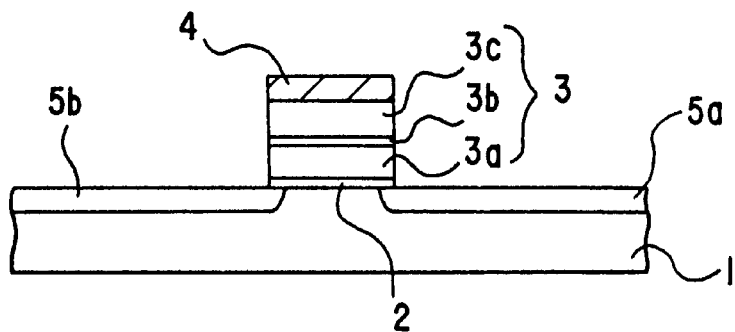
Figure 1B:
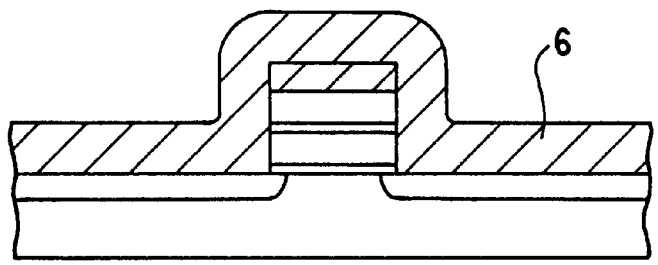
Figure 1C:
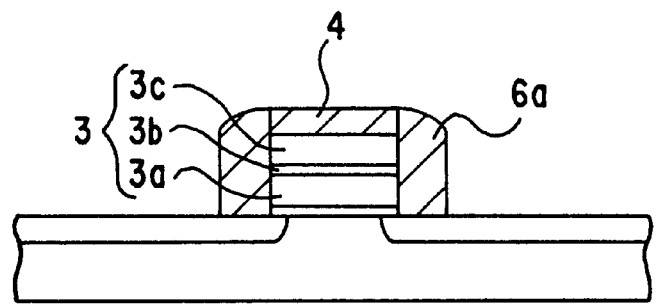
Figure 1D:
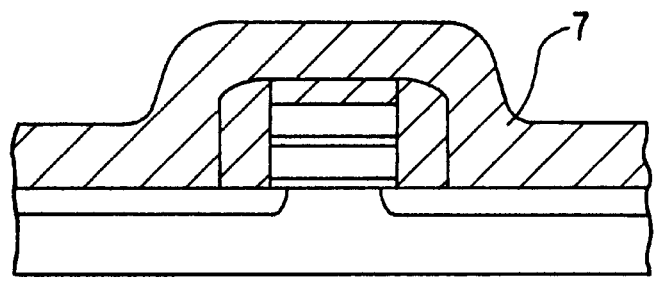
Figure 2:
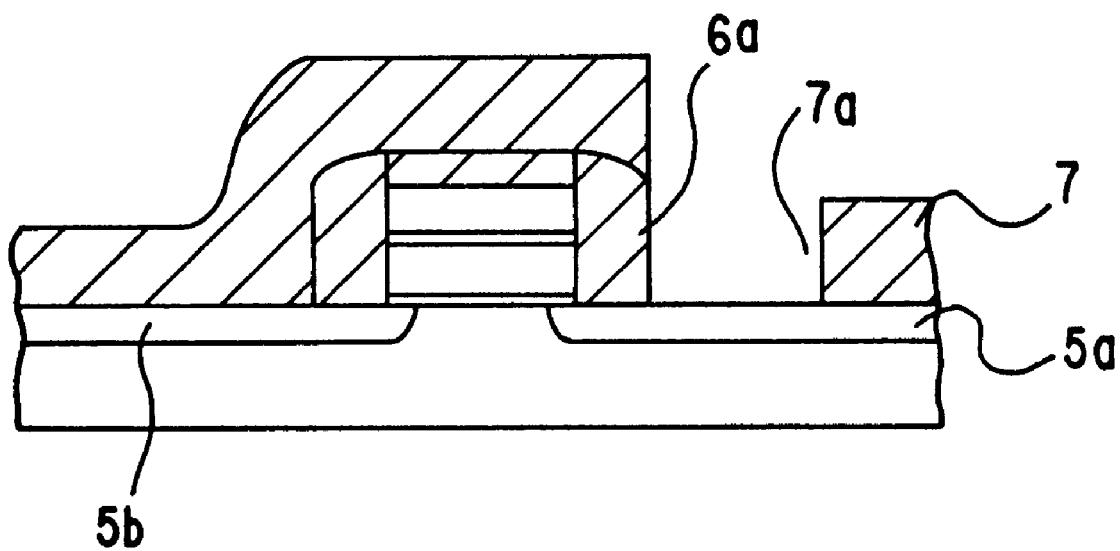
FIG. 2 is a sectional view for explaining a problem of the prior art.
Figure 3A:
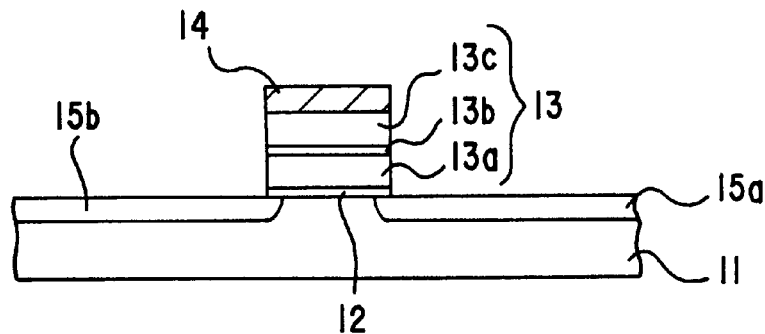
FIG. 3A to FIG. 3H are sectional views for explaining a method for manufacturing the insulated-gate field effect transistor of an embodiment of the present invention having a contact hole formed in an inter-layer insulating film on an S/D region of the both sides of a gate electrode.

FIG. 3A shows a state after an S/D region is formed in the surface layer of a semiconductor substrate of the both sides of a gate electrode having a floating gate and control gate.

In FIG. 3A, symbol 11 is a semiconductor substrate made of silicon and 12 is a gate insulating film made of a silicon dioxide film formed on the semiconductor substrate 11.

Symbol 13 is a gate electrode, comprising a floating gate 13a and control gate 13c formed above a floating 13a in the state of putting an insulating film 13b between them. The floating gate 13a and control gate 13c are made of polycrystalline silicon and the insulating film 13b is made of a silicon dioxide film.

Symbol 14 is an insulating film on the control gate 13c. 15a and 15b are S/D regions formed in the surface layer of the semiconductor substrate 11 of the both sides of the gate electrode 13.

Figure 4A:
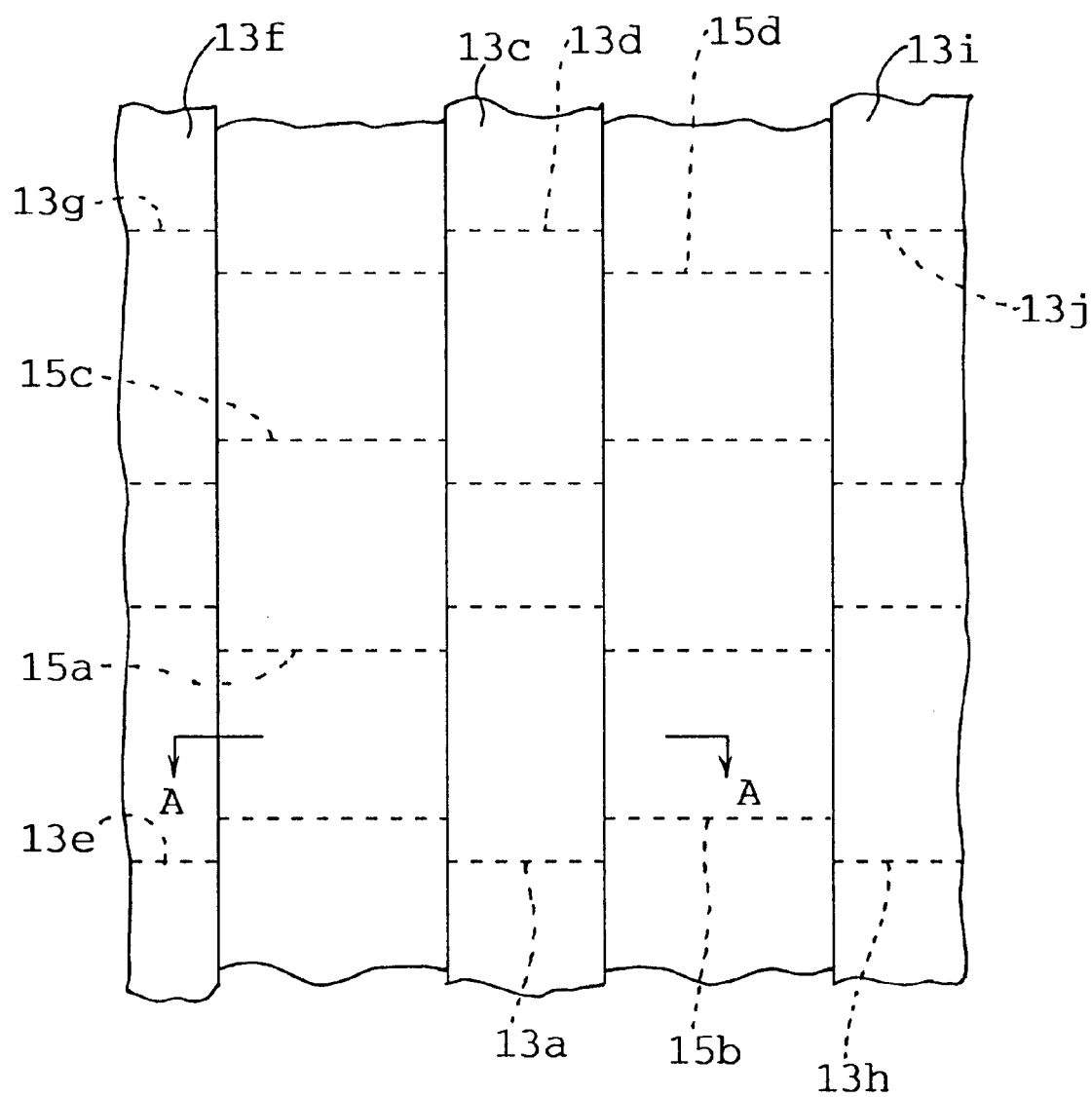
FIG. 4A to FIG. 4E are top views for explaining a method for manufacturing the insulated-gate field effect transistor of the embodiment of the present invention having a contact hole formed in an inter-layer insulating film on an S/D region of both sides of a gate electrode, sectional views taken along the lines A—A in FIG. 4A and FIG. 4D correspond to FIG. 3A and FIG. 3E respectively and sectional view taken along the lines B—B in FIG. 4D corresponds to FIG. 4E.

A plurality of insulated-gate field effect transistors are formed in an EPROM. Therefore, as shown in FIG. 4A, floating gates 13a, 13d, 13e, 13g, 13h, and 13j are formed separately from each other for each insulated-gate field effect transistor. The floating gates 13a and 13d are covered with a strip-shaped control gate 13c common to them, the floating gates 13e and 13g are covered with a strip-shaped control gate 13f common to them and the floating gates 13h and 13j are covered with a strip-shaped control gate 13i common to them. The control gates 13c, 13f, and 13i are arranged in parallel at predetermined intervals and connected to a word line.

Moreover, SID regions 15a to 15d are formed in the surface layer of the semiconductor substrate 11 between the control gates 13c, 13f and 13i and at that of both sides of the floating gates 13a, 13d, 13e, 13g, 13h and 13j. However, the SID region of another side of the floating gates 13e, 13g, 13h, and 13j is not illustrated. In this case, a region between the control gates 13c and 13f is called such a side that a contact hole is formed where a contact hole is formed on the SID regions 15a and 15c, while a region between the control gates 13c and 13i is called such an other side that a contact hole is not formed where a bulk interconnection layer for electrically connecting the S/D regions 15b and 15d with each other is formed in the surface layer of the semiconductor substrate 11.

The S/D region 15a serves as a source or drain region common to adjacent insulated-gate field effect transistors having the floating gates 13a and 13e.

The SID region 15b serves as a drain or source region common to adjacent insulated-gate field effect transistors having the floating gates 13a and 13h.

The SID region 15c serves as a source or drain region common to adjacent insulated-gate field effect transistors having the floating gates 13d and 13g.

The S/D region 15d serves as a drain or source region common to adjacent insulated-gate field effect transistors having the floating gates 13d and 13j.

Figure 3B:
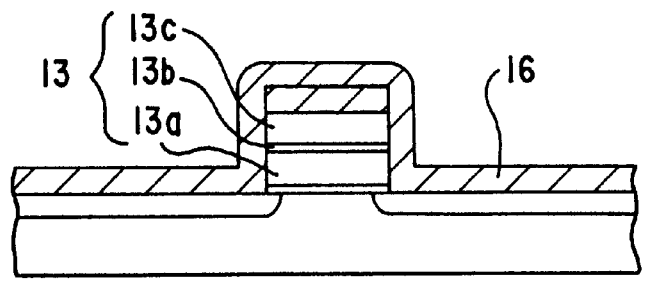

First, to form insulating side walls 16a to 16d along the side surfaces of the control gates 13c, 13f, and 13i shown in FIG. 4A under the above state, an insulating film 16 made of a silicon dioxide film with the thickness of 3,000–4,000 Å on the entire surface of the semiconductor substrate 11. FIG. 3B shows a sectional view of the film 16 taken along the line A—A in FIG. 4A.

Figure 3C:
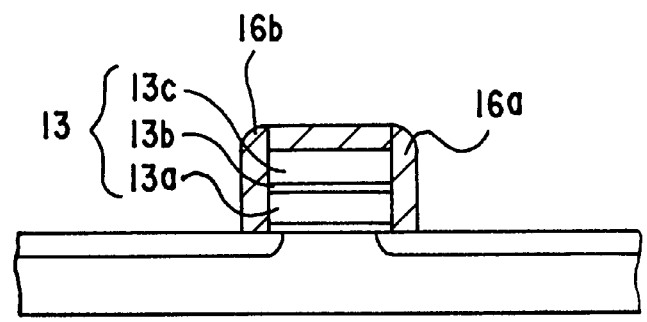
Figure 4B:
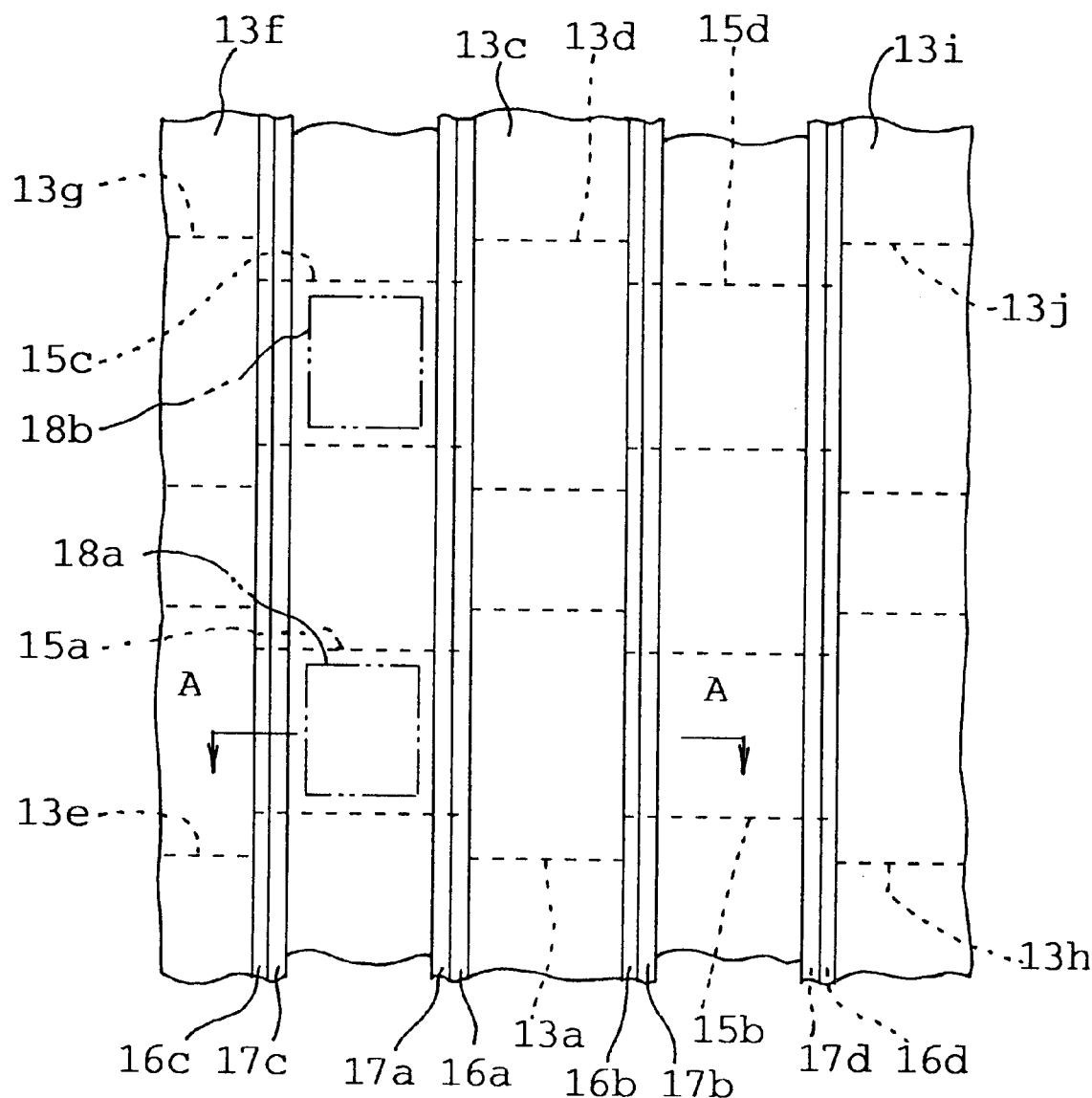

Then, as shown in FIG. 3C, the insulating side wall 16a is formed on the side surface of the gate electrode 13 by anisotropically etching the insulating film 16 by means of the reactive ion etching (hereinafter referred to as RIE) using a fluorine-based gas such as HF. In this case, as shown in FIG. 4B, the insulating side walls 16a to 16d are formed along the side surfaces of the control gates 13c, 13f, and 13i.

Figure 3D:
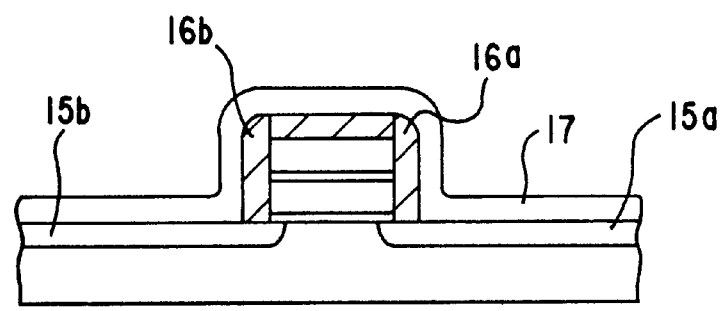

Next, as shown in FIG. 3D, a polycrystalline silicon film (conducting film) 17 is formed on the entire surface and thereafter the polycrystalline silicon film 17 is anisotropically etched by RIE using a chlorine-base gas. Thereby, as shown in FIG. 4B, polycrystalline silicon films (conducting side walls) 17a to 17d respectively covering the side surfaces of the insulating side walls 16a to 16d and respectively contacting the semiconductor substrate 11 are left.

Figure 4C:
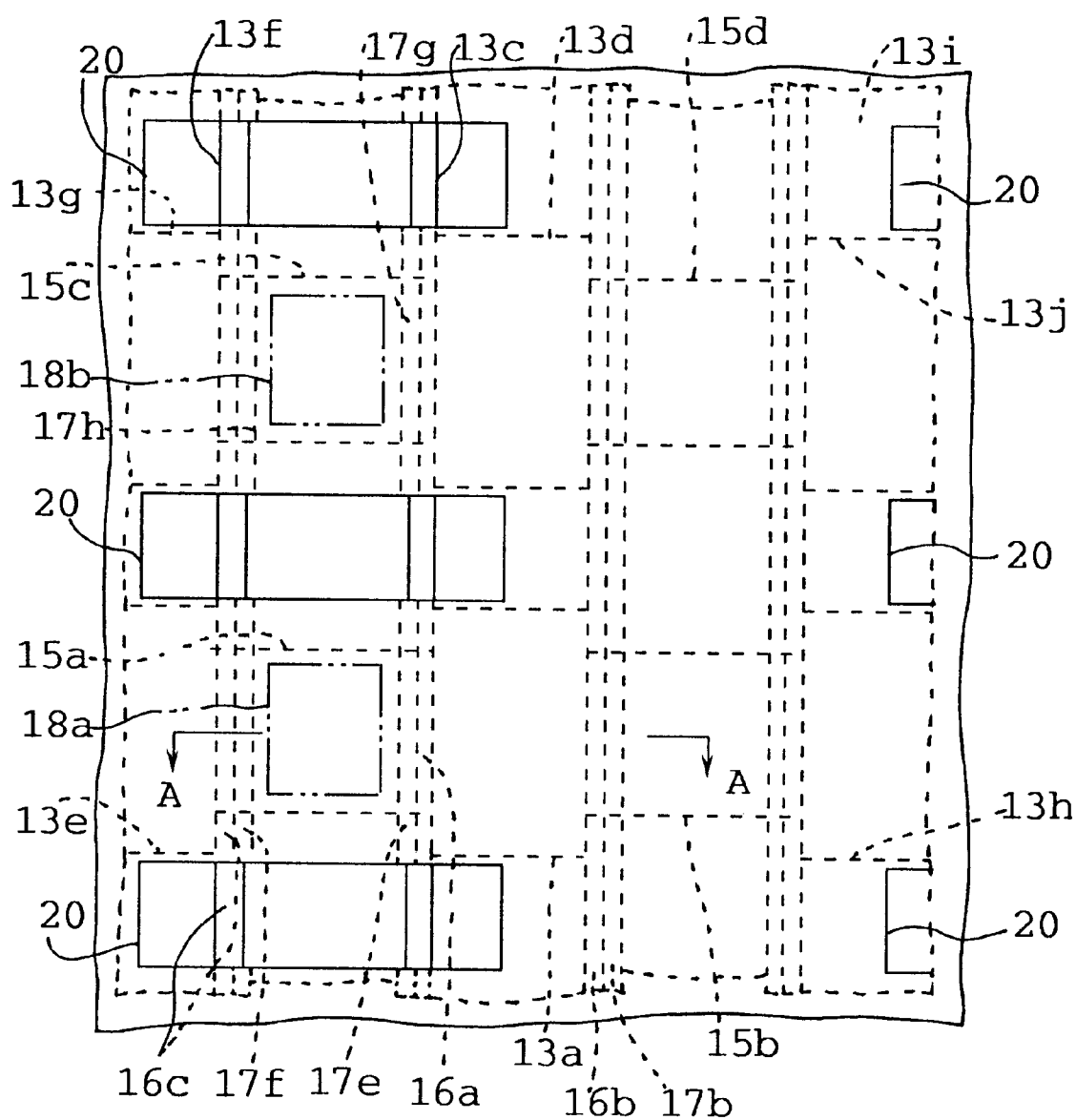

Subsequently, a resist film is formed and thereafter a window 20 of the resist film is patterned so that the conducting side walls 17a and 17c in a region between the S/D regions 15a and 15c of the side for forming a contact hole are exposed. Next, as shown in FIG. 4C, the conducting side walls 17a and 17c are selectively etched through the window 20 and partly removed. Thereby, the conducting side walls 17a and 17c are electrically separated for each transistor so that the conducting side walls 17e and 17f contacting the S/D region 15a and the side walls 17g and 17h contacting the S/D region 15c are left.

Figure 3E:
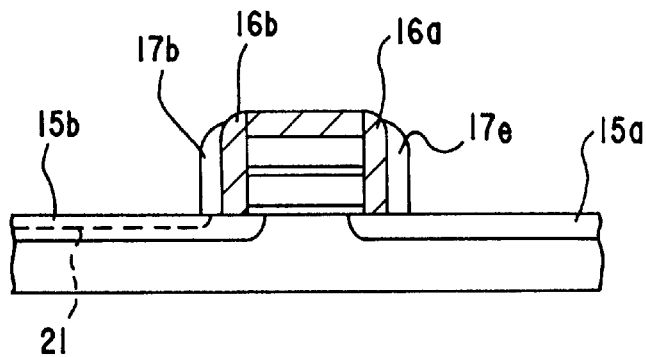
Figure 4D:
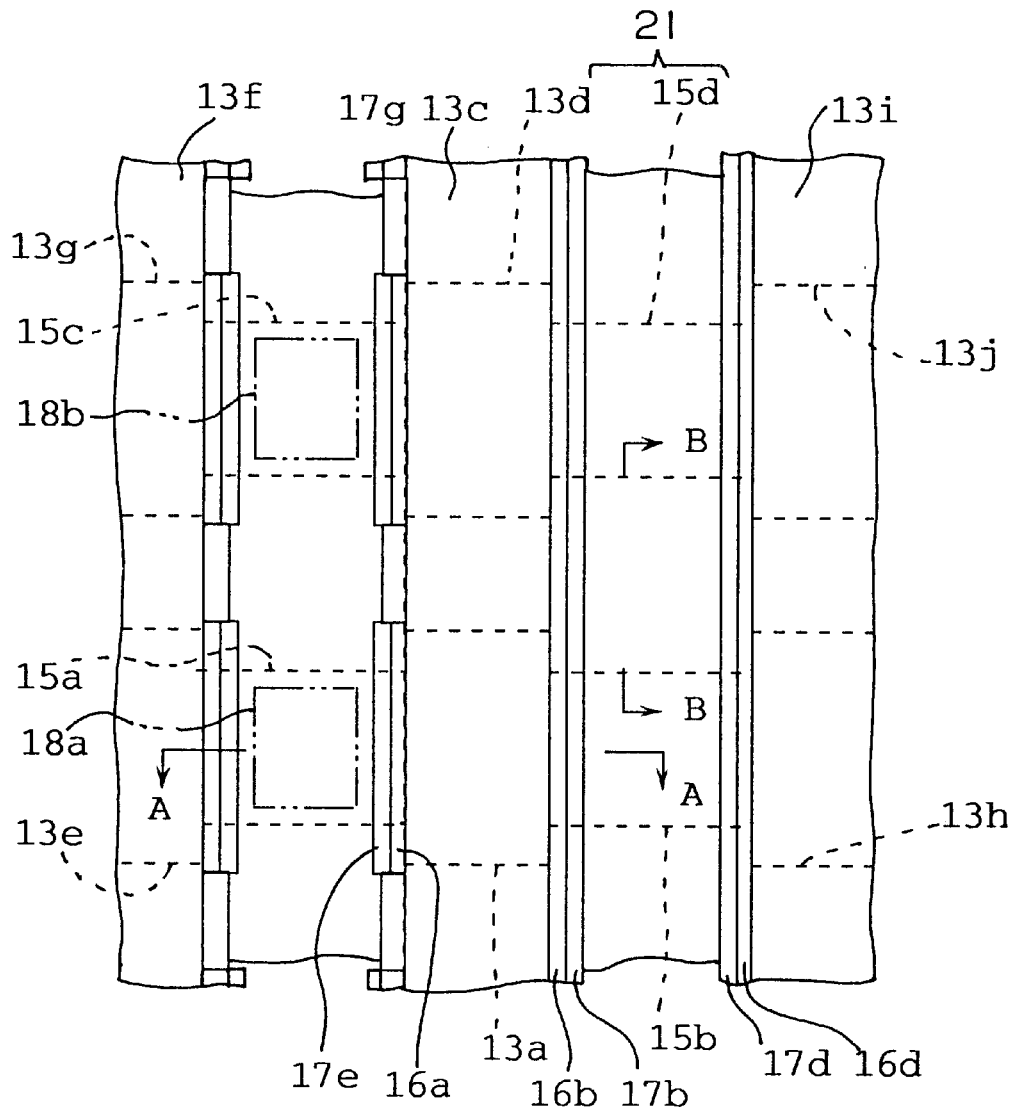
Figure 4E:
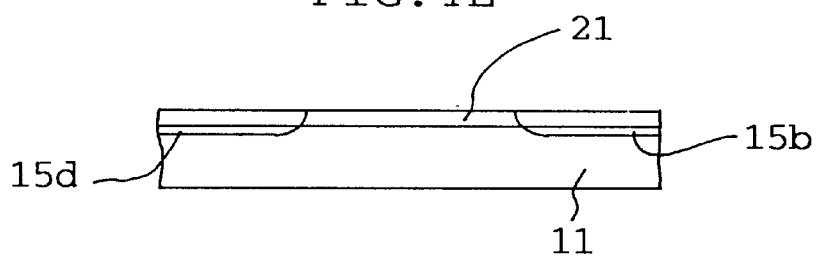

Then, after the resist film is removed, as shown in FIG. 4D, the side for forming a contact hole is masked with a not-illustrated new resist film to remove a natural oxide film from the surface of the semiconductor substrate 11 of the other side. Subsequently, conductivity-type impurities same as those in the S/D regions 15b and 15d are introduced into the region to form a bulk interconnection layer in the surface layer of the semiconductor substrate 11 and electrically connect the S/D regions 15b and 15d of the other side each other. In this case, the conducting side walls 17b and 17d serve as masks for removing a natural oxide film and introducing impurities. Moreover, the bulk interconnection layer serves as a source line 21. FIG. 3E shows a sectional view taken along the line A—A in FIG. 4D and FIG. 4E shows a sectional view taken along the line B—B in FIG. 4D.

Figure 3F:
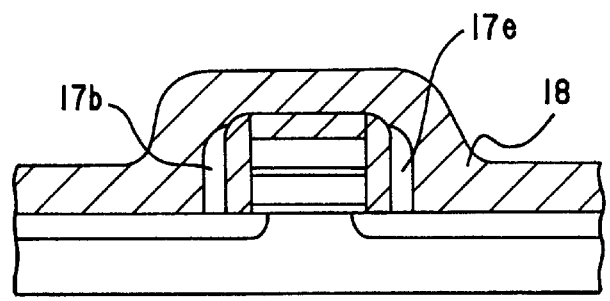

After that, as shown in FIG. 3F, an inter-layer insulating film 18 is formed on the entire surface.

Figure 3G:
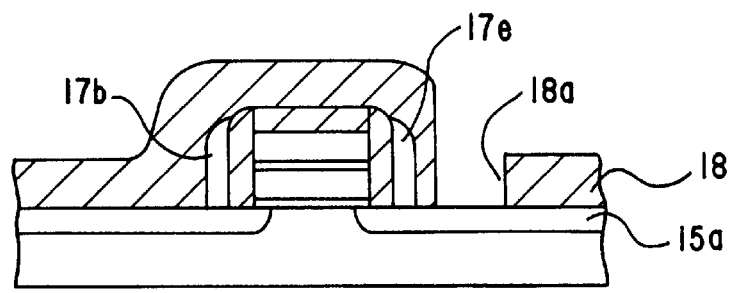

Then, as shown in FIG. 3G, the inter-layer insulating film 18 on the S/D region 15a is selectively etched and removed by a fluorine-base etching gas to form a contact hole 18a in the inter-layer insulating film 18 on the S/D region 15a. In this case, a contact hole 18b is also formed on the S/D region 15c shown in FIG. 4D at the same time.

Figure 3H:
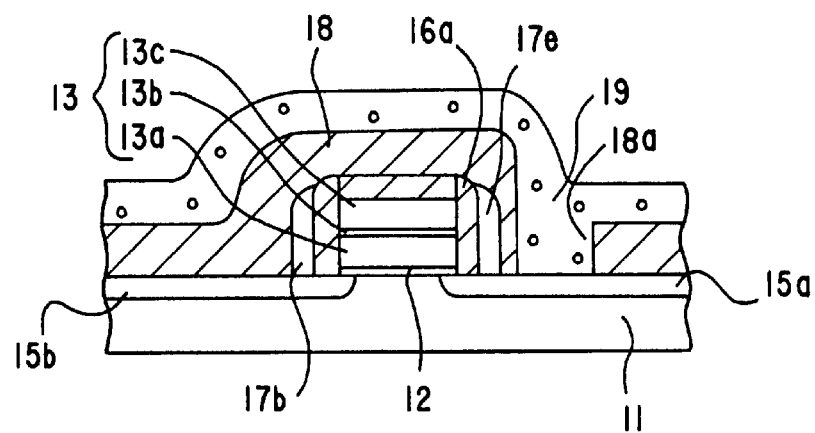

Next, as shown in FIG. 3H, an aluminum film is formed and thereafter patterned to form an S/D electrode or interconnection layer 19 connecting with the S/D regions 15a and 15c through the contact holes 18a and 18b. In this case, an S/D electrode or interconnection layer connecting with the S/D region 15c through the contact hole 18b shown in FIG. 4C is formed at the same time.

Then, an EPROM having the connection shown in FIG. 5 is completed after predetermined steps. In FIG. 5, symbol 21 is a source line where sources of a desired transistor are connected each other and connected to a power-supply line Vs. Symbol 22 is a word line which is connected with the control gate electrode 13c. Symbol 23 is a bit line which is connected with the drain of each transistor. Symbol 24 is a row decoder for sending an address signal to the control gate 13c of a desired transistor through each word line 22 and 25 is a column decoder for sending an address signal to the drain of a desired transistor through each bit line 23.

As described above, the embodiment of the present invention has the conducting side wall 17e covering the insulating side wall 16a of the side where the contact hole 18a is formed and also contacting with the S/D region 15a.

Figure 6:
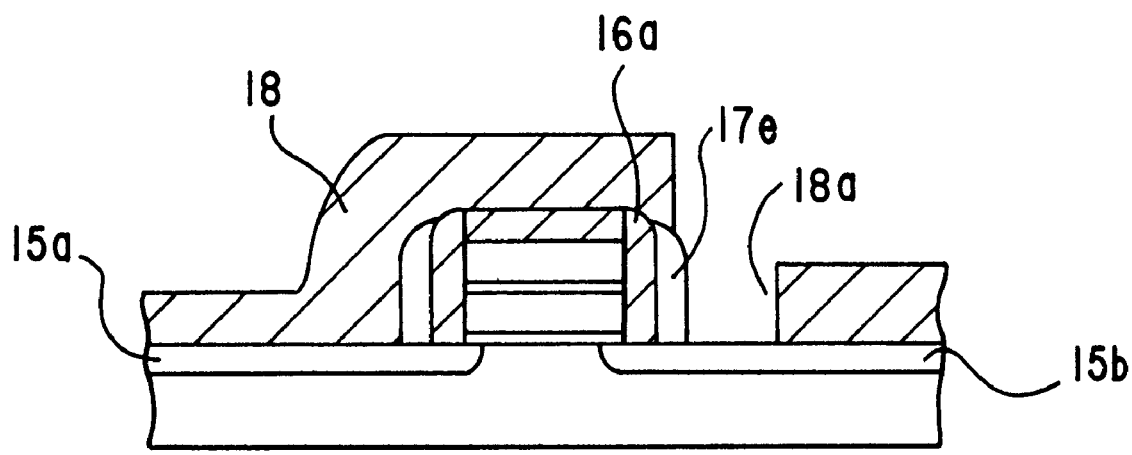
FIG. 6 is a sectional view for explaining the function and advantage of the insulated-gate field effect transistor of the embodiment of the present invention.

Therefore, when forming the contact hole 18a in the inter-layer insulating film 18 covering them, the contact hole 18a is formed on the conducting side wall 17e even if the contact hole 18a approaches the gate electrode 13 due to a deviation of an alignment as shown in FIG. 6. In this case, the insulating side wall 16a between the gate electrode 13 and conducting side wall 17e is not exposed to an etchant for forming the contact hole 18a in the inter-layer insulating film 18 because the insulating side wall 16a is covered with the conducting side wall 17e. Therefore, the insulating side wall 16a keeps the initial thickness. When the S/D electrode or interconnection layer 19 is formed in the contact hole 18a under the above state, only the insulating side wall 16a remains as an insulating film actually present between the S/D electrode or interconnection layer 19 and the gate electrode 13 because the S/D electrode or interconnection layer 19 contacts the conducting side wall 17e.

Accordingly, its thickness is kept constant independently of the position of the contact hole.

In case that the contact hole 18a goes away from the gate electrode, the conducting side wall 17e is covered with the inter-layer insulating film 18a and the S/D electrode or interconnection layer 19 formed in the contact hole 18b does not contact the conducting side wall 17e as shown in FIG. 3E. Even in this case, as both the conducting side wall 17e and S/D electrode or interconnection layer 19 contact the S/D region, the conducting side wall 17e and the S/D electrode or interconnection layer 19 have the same potential, so that only the insulating side wall 16a remains as an insulating film actually present between the S/D electrode or interconnection layer 19 and the gate electrode 13.

Accordingly, its thickness is kept constant independently of the position of the contact hole as shown in FIG. 3H.

Therefore, it is possible to prevent parasitic capacitances from fluctuating or accumulated charges from fluctuating due to leakage of them.

Moreover, when forming the source line 21 by selectively introducing conductivity-type impurities same as those of the S/D regions 15b and 15d into the semiconductor substrate 11 of the other side that a contact hole is not formed, as shown in FIG. 4D and FIG. 4E, the conducting side wall 17b on the side surface of the control gate 13c is left at the other side and serves as a mask for removing a natural oxide film and introducing impurities while the semiconductor substrate 11 is masked with a not-illustrated new resist film of the side for forming a contact hole.

Thus, the allowance for mask alignment increases by the width of the polycrystalline silicon film 17b so that a patterning of a mask is easy. Moreover, a sufficient space between a channel region under the gate electrode and a bulk interconnection layer is secured so that preventing a channel length from becoming short and a gate control voltage from fluctuating.

For this embodiment, the polycrystalline silicon film 17 is used for the material of the conducting side wall. However, it is also possible to use other type of conducting side wall such as a refractory metal film or refractory metal silicide film.

As shown in FIG. 3A, the present invention is applied to an insulated-gate field effect transistor having the gate electrode 13 which comprises the floating gate 13a and control gate 13c above the floating gate 13a. However, the present invention can also be applied to an insulated-gate field effect transistor having a gate electrode which comprises only one layer.

Moreover, it is possible to replace the step of patterning the polycrystalline silicon film 17a shown in FIG. 4C with the step of introducing conductivity-type impurities into the semiconductor substrate 11 shown in FIG. 4D.

What is claimed is:

1. A semiconductor device comprising:

a strip-shaped conducting film passing through a plurality of element forming regions on a semiconductor layer, being formed on a gate insulating film in each element forming region, and serving as a gate electrode;

a plurality of source/drain regions formed in the semiconductor layer on a first side and a second side of the strip-shaped conducting film in each of the element forming regions;

a first insulating side wall and a second insulating side wall formed on the first and the second sides of the strip-shaped conducting film;

a plurality of first conducting side walls covering a side surface of the first insulating side wall on the first side of the strip-shaped conducting film, each of said first conducting side walls contacting the source/drain regions in each element forming region on the first side of the strip-shaped conducting film, and being electrically separated for each of the element forming regions;

a second conducting side wall formed along a side surface of the second insulating side wall on the second side of the strip-shaped conducting film so as to cover the second insulating side wall;

a bulk interconnection layer formed in the semiconductor layer outside of the second conducting side wall by introducing conductivity-type impurities same as those in the source/drain regions and electrically connecting the plurality of source/drain regions on the second side of the strip-shaped conducting film;

a covering insulating film for covering the strip-shaped conducing film, the source/drain regions, the first and second insulating side walls, the first and second conducting side walls, and the bulk interconnection layer; and a contact hole formed in the covering insulating film over at least one of said source/drain regions on the first side of the strip-shaped conducing film, said contact hole being formed to expose one of said plurality of first conducting side walls within said contact hole.

2. A semiconductor device according to claim 1, wherein the conducting film serves as a control gate common to the element forming regions and floating gates are formed under the control gate through an insulating film and electrically separated for each of the element forming regions.

3. A semiconductor device according to claim 1, wherein the first and second conducting side walls are made of any one of a polycrystalline silicon film, refractory metal film, and refractory metal silicide film.

* * * * *